(12) United States Patent
Ong et al.

(10) Patent No.: US 7,892,905 B2
(45) Date of Patent: Feb. 22, 2011

(54) FORMATION OF STRAINED SI CHANNEL AND $SI_{1-x}GE_x$ SOURCE/DRAIN STRUCTURES USING LASER ANNEALING

(75) Inventors: Kuang Kian Ong, Singapore (SG); Kin Leong Pey, Singapore (SG); King Jien Chui, Singapore (SG); Ganesh Samudra, Singapore (SG); Yee Chia Yeo, Singapore (SG); Yung Fu Chong, Singapore (SG)

(73) Assignee: Globalfoundries Singapore Pte. Ltd., Singapore (SG)

( * ) Notice: Subject to any disclaimer, the term of this patent is extended or adjusted under 35 U.S.C. 154(b) by 801 days.

(21) Appl. No.: 11/195,196

(22) Filed: Aug. 2, 2005

(65) Prior Publication Data

US 2007/0032026 A1 Feb. 8, 2007

(51) Int. Cl.
*H01L 31/0216* (2006.01)
*H01L 21/336* (2006.01)

(52) U.S. Cl. ............... 438/198; 438/584; 438/664; 438/938; 257/19; 257/616; 257/E29.193; 257/E21.182

(58) Field of Classification Search ............. 257/18–19, 257/616, E21.182, E29.193, E31.035, E31.046, 257/E31.049; 438/150, 166, 168, 187, 198, 438/938, FOR. 291
See application file for complete search history.

(56) References Cited

U.S. PATENT DOCUMENTS

| | | | |
|---|---|---|---|
| 5,242,847 A * | 9/1993 | Ozturk et al. ............... 438/300 |
| 6,207,563 B1 * | 3/2001 | Wieczorek et al. ........... 438/664 |
| 6,544,854 B1 | 4/2003 | Puchner et al. |
| 6,605,518 B1 * | 8/2003 | Ohmi et al. ................. 438/458 |
| 6,621,131 B2 | 9/2003 | Murthy et al. |
| 6,682,965 B1 * | 1/2004 | Noguchi et al. ............. 438/199 |
| 6,717,216 B1 | 4/2004 | Doris et al. |
| 6,724,008 B2 | 4/2004 | Fitzergald |
| 6,770,546 B2 | 8/2004 | Yamazaki |
| 6,878,627 B1 * | 4/2005 | Lur et al. .................... 438/683 |
| 6,921,913 B2 | 7/2005 | Yeo et al. |
| 6,982,474 B2 * | 1/2006 | Currie et al. ................ 257/616 |
| 7,238,581 B2 * | 7/2007 | Chui et al. .................. 438/301 |
| 2002/0098689 A1 * | 7/2002 | Chong et al. ................ 438/655 |
| 2006/0022268 A1 * | 2/2006 | Oh et al. ..................... 257/347 |
| 2006/0115934 A1 * | 6/2006 | Kim et al. ................... 438/149 |
| 2006/0226483 A1 * | 10/2006 | Lo et al. ..................... 257/347 |
| 2006/0234455 A1 * | 10/2006 | Chen et al. .................. 438/276 |
| 2009/0134381 A1 * | 5/2009 | Shimamune et al. .......... 257/19 |

* cited by examiner

*Primary Examiner*—Matthew C Landau
*Assistant Examiner*—Maliheh Malek

(57) ABSTRACT

A process for forming a strained channel region for a MOSFET device via formation of adjacent silicon-germanium source/drain regions, has been developed. The process features either blanket deposition of a silicon-germanium layer, or selective growth of a silicon-germanium layer on exposed portions of a source/drain extension region. A laser anneal procedure results in formation of a silicon-germanium source/drain region via consumption of a bottom portion of the silicon-germanium layer and a top portion of the underlying source/drain region. Optimization of the formation of the silicon-germanium source/drain region via laser annealing can be achieved via a pre-amorphization implantation (PAI) procedure applied to exposed portions of the source/drain region prior to deposition of the silicon-germanium layer. Un-reacted top portions of the silicon-germanium layer are selectively removed after the laser anneal procedure.

40 Claims, 7 Drawing Sheets

FORMATION OF STRAINED SI CHANNEL AND $SI_{1-x}GE_x$ SOURCE/DRAIN STRUCTURES USING LASER ANNEALING

BACKGROUND OF THE INVENTION (1) Field of the Invention

The present invention relates to methods used to fabricate semiconductor devices, and more specifically to a method of forming a strained silicon channel region via formation of adjacent silicon-germanium source/drain regions.

(2) Description of Prior Art

The performance of semiconductor devices, specifically metal oxide semiconductor field effect transistor (MOSFET) devices, has been enhanced via the use of a strained silicon layer used to accommodate the device channel region. The strained silicon layer allows the device channel region to experience increased carrier mobility thus increased device performance. One method of forming a strained silicon layer is to grow the silicon layer on an underlying relaxed layer such as a silicon-germanium layer. The attainment of the relaxed silicon-germanium layer can however present a layer comprised with dislocations wherein the same dislocations can propagate to a subsequently grown overlying strained silicon layer. Therefore the enhanced device performance realized with the underlying relaxed layer can however be compromised by possible device leakage due to the propagated dislocations. A second method of forming a strained silicon layer is the formation of source/drain regions comprised of a semiconductor alloy layer such as a silicon-germanium layer. The silicon region located between semiconductor alloy source/drain regions is now in a strained state allowing the enhanced device performance to be achieved. Methods used to form semiconductor alloy source/drain regions can however add unwanted process complexity resulting in lower device yields as well as increased fabrication costs. An example of a process used to form silicon-germanium source/drain regions is the etching or trenching of semiconductor material followed by refill with silicon-germanium. The above process sequence now however requires the semiconductor trenching or recessing procedure which increases process complexity and cost.

The present invention will describe a method of forming a semiconductor device in which a strained silicon channel region is formed between semiconductor alloy source/drain regions however without the complexity of recessing semiconductor material followed by refilling with the semiconductor alloy material. Prior art such as Murthy et al in U.S. Pat. No. 6,621,131 B2, Fitzgerald in U.S. Pat. No. 6,724,008 B2, Doris et al in U.S. Pat. No. 6,717,216 B1, Yamazaki in U.S. Pat. No. 6,770,546 B2, Puchner et al in U.S. Pat. No. 6,544,854 B1, and Yeo et al in 2004/0173815 A1, have described methods of forming a strained silicon layer to accommodate a device channel region, however none of the above prior art describe the unique process sequence of the present invention in which a strained silicon region is formed between semiconductor alloy source/drain regions, wherein the semiconductor alloy source/drain regions are formed using an optimized process sequence that does not require recessing semiconductor material followed by refilling with the semiconductor alloy material.

SUMMARY OF THE INVENTION

It is an object of this invention to form a MOSFET device comprised with a channel region located in a strained silicon region.

It is another object of this invention to employ semiconductor alloy source/drain regions to allow formation of a strained silicon region between the semiconductor alloy source/drain regions.

It is still another object of this invention to form the semiconductor alloy source/drain regions via deposition of a semiconductor or a semiconductor alloy layer followed by laser annealing, with or without a pre-amorphization implant procedure performed to a source/drain region of a semiconductor substrate prior to the deposition of a semiconductor or semiconductor alloy layer.

It is still yet another object of this invention to form a semiconductor alloy source/drain region via selective growth of a semiconductor layer on an underlying source/drain extension region followed by a laser annealing procedure.

In accordance with the present invention methods have been developed to form a strained silicon region for a MOSFET device between semiconductor alloy source/drain regions, wherein the semiconductor alloy source/drain regions are formed using a laser anneal procedure. A first iteration of this invention features the formation of gate structure comprised with sidewall spacers and an overlying hard mask shape, and source/drain extension regions. After deposition of a semiconductor, or of a semiconductor alloy layer, a laser anneal procedure is performed to redistribute a semiconductor alloy component of the semiconductor alloy layer, and silicon from the source/drain regions, forming the semiconductor alloy source/drain regions. Selective removal of un-reacted portions of the semiconductor alloy layer follows. A second iteration of this invention features a pre-amorphization implantation procedure performed to the source/drain regions prior to deposition of a semiconductor alloy layer. Laser annealing is again used to form the semiconductor alloy source/drain region from the amorphous silicon source/drain regions, followed by removal of un-reacted portions of the semiconductor alloy layer. A third iteration of this invention features selective epitaxial growth of a semiconductor alloy layer on an underlying source/drain region followed by the laser anneal procedure again forming a semiconductor alloy source/drain region. Un-reacted portions of the semiconductor alloy layer residing overlying the semiconductor alloy source/drain regions are selectively removed.

BRIEF DESCRIPTION OF THE DRAWINGS

The object and other advantages of this invention are best described in the preferred embodiment with reference to the attached drawings that include.

DESCRIPTION OF THE PREFERRED EMBODIMENT

Figure 1:
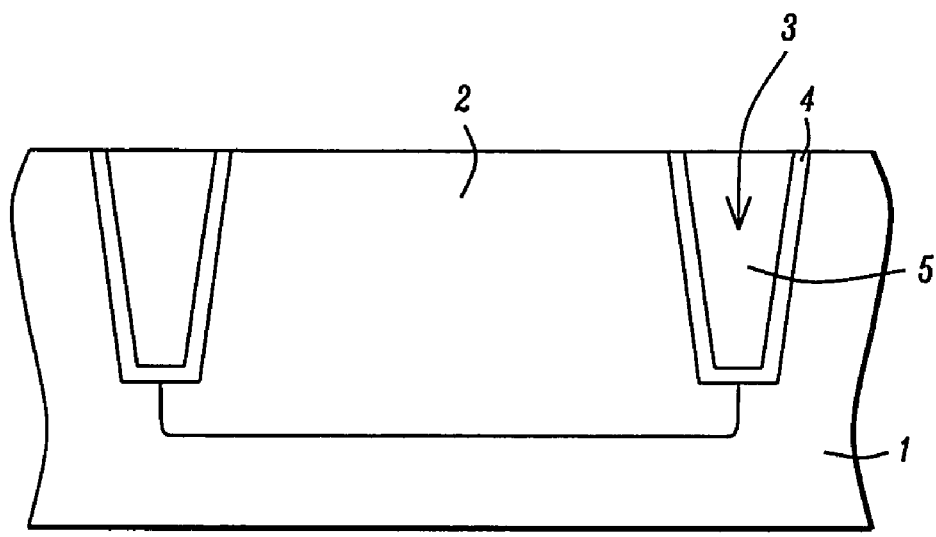
FIGS. 1-13, which schematically in cross-sectional style describe key fabrication stages featured in the formation of a semiconductor alloy source/drain region, used in turn to create a strained silicon channel region for a MOSFET device located between the semiconductor alloy source/drain region. The figures are for illustrative purposes only, and the source/drain extensions may under lap the gate though it might be shown otherwise in FIGS. 1-13.
Figure 2:
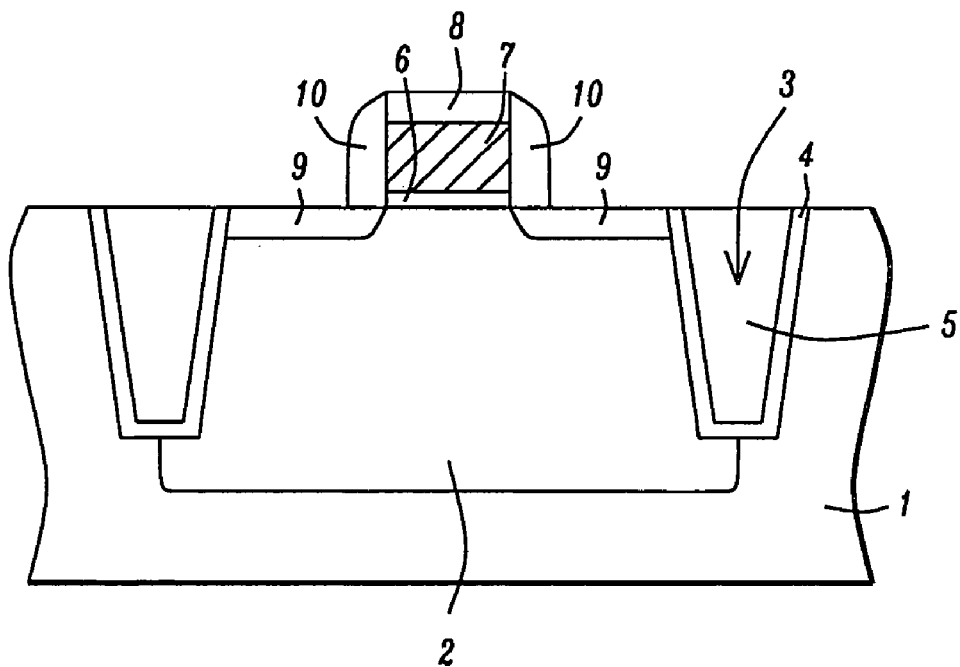

Processes used to form semiconductor alloy source/drain regions for a MOSFET device wherein the semiconductor alloy source/drain regions are formed featuring laser annealing, and wherein the semiconductor alloy source/drain regions are used to create a strained silicon region in a top portion of a semiconductor substrate located between the semiconductor alloy source/drain regions, will now be described in detail. FIGS. 1-2, describe the steps employed for MOSFET fabrication prior to initiating the semiconductor alloy source/drain process sequence. Semiconductor substrate 1, comprised of P type single crystalline silicon with a <100>, <110> or <111> crystallographic orientation is used. The semiconductor substrate can include Silicon-on-Insulator (SOI) as well. Shallow trench isolation (STI) structures or other isolation structures 3, are next formed via defining a trench or other appropriate shape in top portions of semiconductor substrate 1, lining the sides of the shallow trench shape with thermally grown silicon dioxide layer 4, then filling the shallow trench shapes with insulator layer 5, an insulator layer such as chemically vapor deposited silicon oxide. Well region 2, an N type well region if a P channel MOSFET device is desired, or a P type well region if an N channel MOSFET device is needed, is next formed in a top portion of semiconductor substrate 1, between STI regions 3, via ion implantation and annealing procedures. The result of these procedures is schematically shown in FIG. 1.

Gate insulator layer 6, comprised of silicon dioxide is next obtained via thermal oxidation procedures to a thickness between about 10 to 50 Angstroms, and more preferably between about 10 to 20 Angstroms. Alternatively, high-k dielectric materials, such as hafnium/aluminum/oxide (HfAlO), which have a higher dielectric constant (k value) compared to silicon oxide may be used to form the insulating layer. A conductive layer such as a doped polysilicon layer, a metal silicide or a metal layer is next deposited via low pressure chemical vapor deposition (LPCVD), or via plasma enhanced chemical vapor deposition (PECVD) procedures, to a thickness between about 1000 to 2000 Angstroms, followed by another optional LPCVD or PECVD procedure used for deposition of an overlying insulator layer such as silicon dioxide overlying silicon nitride, at a thickness between about 100 to 200 Angstroms. Photolithographic and selective dry etch procedures are next used to form conductive gate structure 7, on gate insulator layer 6, with hard insulator shape 8, overlying conductive gate structure 7. Removal of the photoresist shape used for definition of the above structure is accomplished via plasma oxygen ashing and final wet clean procedures with a buffered hydrofluoric (BHF) component of the wet clean procedure removing portions of gate insulator layer 6, not covered by the conductive gate structure. Source/drain extension region 9, is next formed via ion implantation procedures in portions of well region 2, not covered by the conductive gate structure 7. If a P channel MOSFET device is to be fabricated source/drain extension region 9, will be formed via boron or any other P type dopant ion implantation, or if an N channel MOSFET device is needed an N type source/drain extension region will be formed via an arsenic, phosphorous or any other N type dopant ion implantation procedure. Insulator sidewall spacers 10, are next formed on the sides of conductive gate structure 7, and on the sides of hard insulator shape 8, via deposition of an insulator layer such as silicon oxide or/and silicon nitride at a thickness between about 100 to 800 Angstroms, and more preferably between about 600 to 800 Angstroms, via PECVD or LPCVD procedures followed by a selective anisotropic dry etch procedure such as a reactive ion etch (RIB) procedure using $CF_4$ or $CHF_3$ as a selective etchant. The result of the above procedures is schematically shown in FIG. 2.

Figure 3:
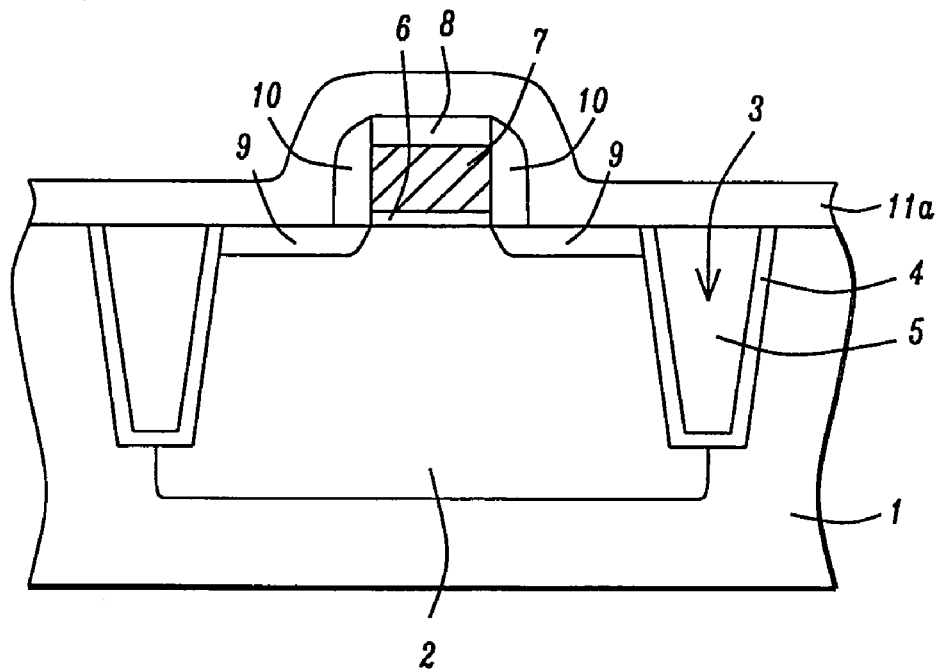
Figure 4:
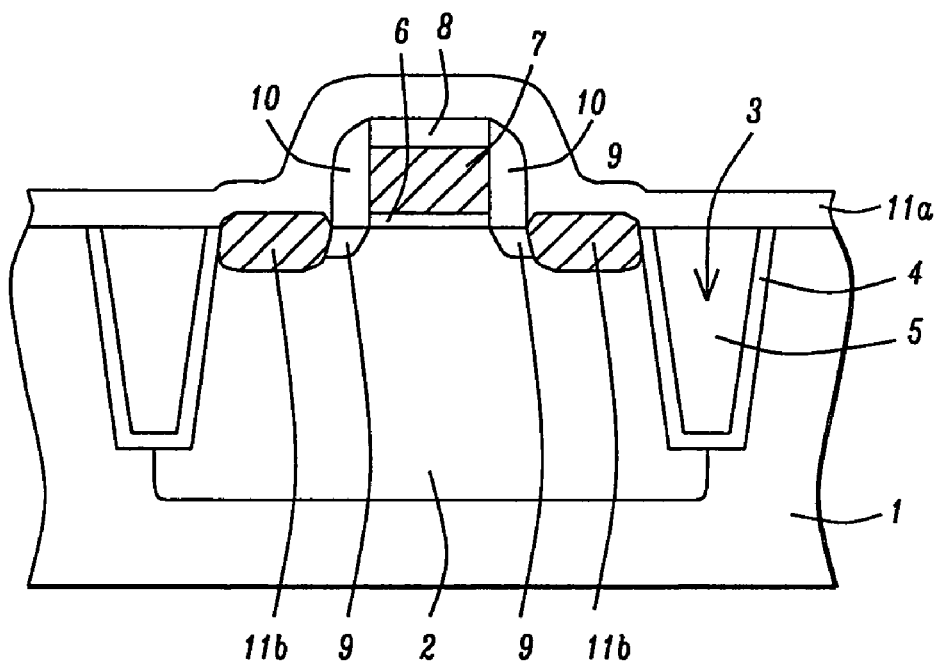
Figure 5:
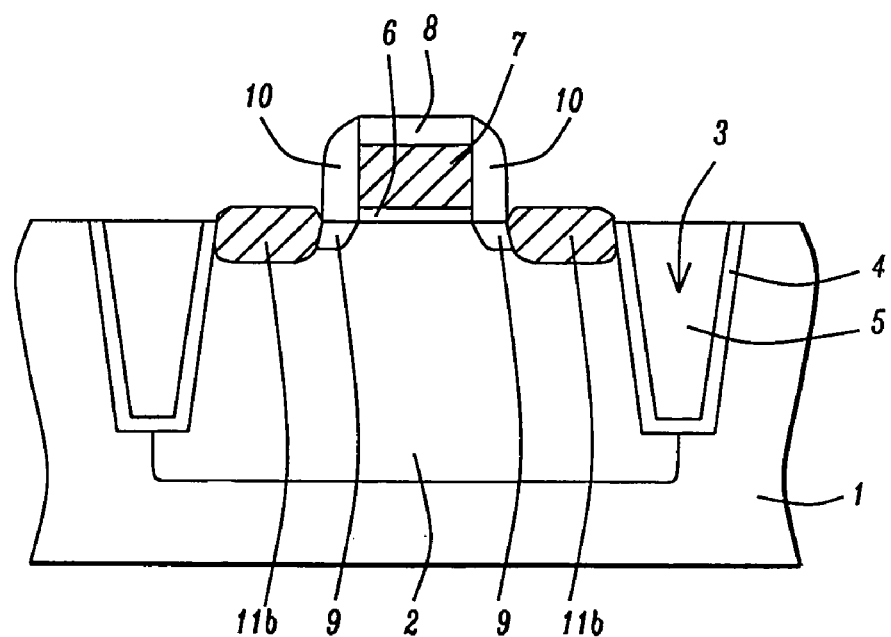

A first iteration of this invention regarding the formation of a semiconductor alloy source/drain region is next described and schematically illustrated using FIGS. 3-5. Layer 11 a, comprised of either germanium or silicon-germanium ($Si_{1-x}Ge_x$), is next deposited via chemical vapor deposition procedures such as LPCVD, to a thickness between about 200 to 2000 Angstroms. The content (x), of germanium in $Si_{1-x}Ge_x$ is between about 10 to 100 weight percent, and more preferably between about 60 to 100 weight percent. Layer 11a, can also be comprised of any strain inducing element. By strain inducing element we mean a difference of more than 2% in atomic size compared with silicon. This is schematically shown in FIG. 3.

A critical laser anneal procedure is now employed to melt layer 11a, and portions of well region 2, at the source/drain region not covered by conductive gate structure 7, redistributing silicon and germanium atoms in melted regions with the melted regions re-crystallizing through liquid phase epitaxy forming semiconductor alloy source/drain regions 11b. The extent of formation of semiconductor alloy source/drain regions 11b, is determined via the extent of melting which in turn is determined by the laser anneal conditions. The laser anneal is performed with single or multiple irradiation of laser light at a laser energy density of fluence generating a temperature about 1415° C., the melting temperature of crystalline silicon. The laser wavelength is preferably between about 157 to 308 nanometers. The laser energy density is controlled between about 0.1 to 1.5 $J/cm^2$.

The laser anneal conditions used for formation of semiconductor alloy, or silicon-germanium source/drain regions 11b, resulted in a top portion of layer 11a, remaining un-reacted. This is schematically shown in FIG. 4. Un-reacted portions of silicon-germanium layer 11a, are selectively removed in a solution. An example of such a solution can be comprised of between 30 to 32% hydrogen peroxide ($H_2O_2$), or via use of hot or boiling water at 90° C. or more. The re-crystallized silicon-germanium source/drain region 11b, is not removed during the above selective wet etch procedure. The result of the selective removal of deposited silicon-germanium layer 11a, is schematically shown in FIG. 5.

Figure 6:
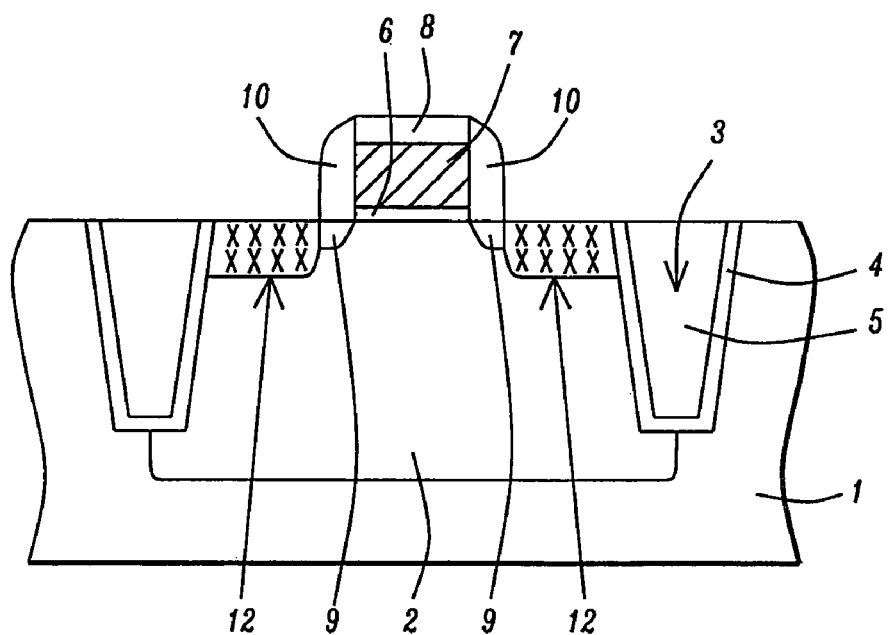
Figure 7:
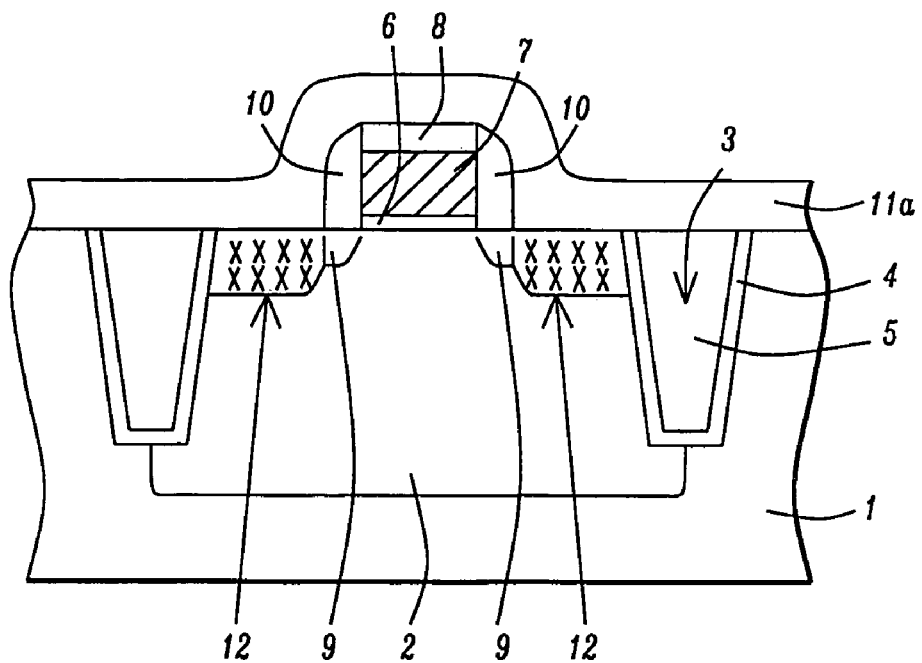

A second iteration of this invention featuring the formation of a semiconductor alloy source/drain region is next described and schematically illustrated using FIGS. 6-9. To optimize the formation of semiconductor alloy source/drain regions exposed portions of silicon in well region 2, the source/drain regions are exposed to a pre-amorphization implant (PM) procedure. The PM procedure performed using silicon or germanium ions 12, at an energy between about 10 to 50 KeV, at an implant dose between about 1E14 to 1E16 $atoms/cm^2$, results in implanted portions of well region 2 at source/drain regions, now comprised of amorphous silicon at a depth between 200 to 1500 Angstroms. This is schematically shown in FIG. 6. The amorphous silicon will allow optimization of a subsequently formed silicon-germanium source/drain region to be realized via laser anneal procedures.

Layer 11a, shown schematically in FIG. 7, again comprised of either germanium or silicon-germanium ($Si_{1-x}Ge_x$) is next deposited via chemical vapor deposition procedures such as LPCVD, again to a thickness between about 200 to 2000 Angstroms. The content (x), of germanium in $Si_{1-x}Ge_x$ is between about 10 to 100 weight percent, and more preferably between about 60 to 100 weight percent. Layer 11a, can also be comprised of any strain inducing element. However in this iteration layer 11a is deposited on amorphous silicon, resulting from the PAI procedure.

Figure 8:
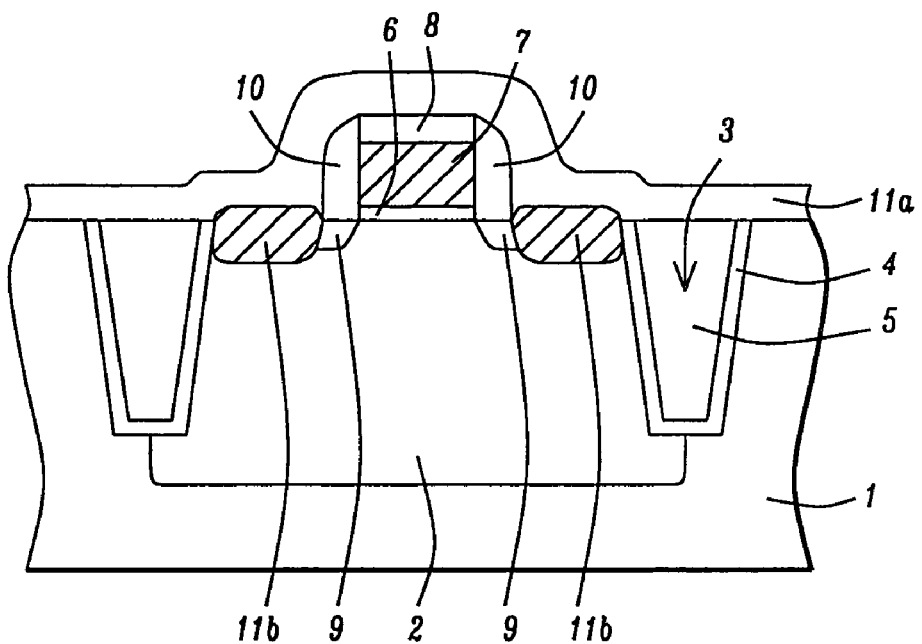
Figure 9:
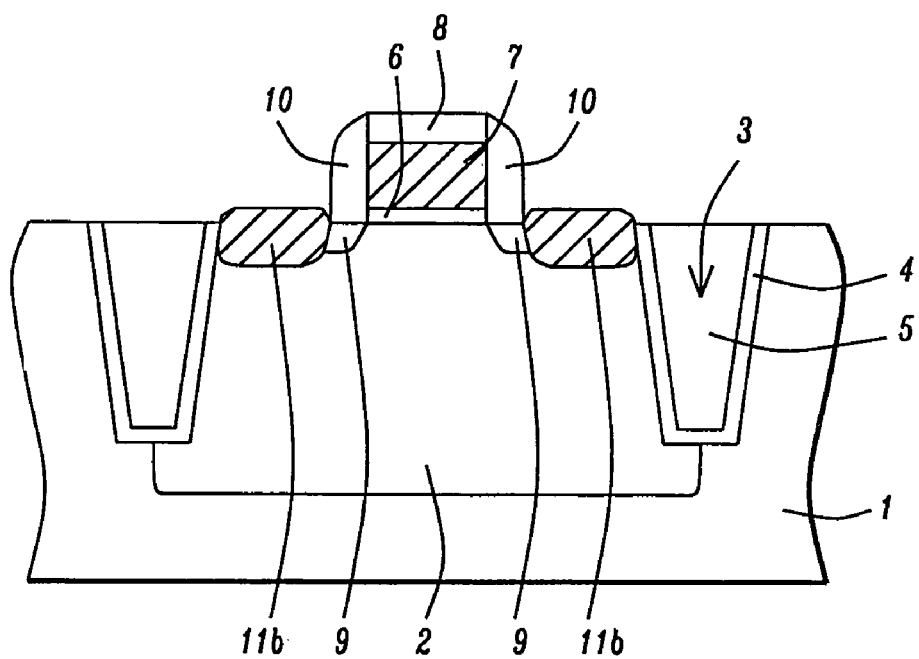

The same critical laser anneal procedure described for the first iteration is again employed to melt layer 11a and preamorphized region 12, redistributing silicon and germanium atoms in melted regions with the melted regions re-crystallizing through liquid phase epitaxy forming semiconductor alloy source/drains region 11b. The extent of formation of semiconductor alloy source/drain regions 11b, is determined via the extent of melting which in turn is determined by the laser anneal conditions and the depth of the amorphous silicon, as a result of the presence of amorphous silicon as a component for creation of the silicon-germanium source/drain region formation. The presence of the amorphous silicon obtained via the PAI process improved the process window by about 250° C., as a result that the melting temperature of the amorphous silicon is about 250° C. lower than that of crystalline silicon. The laser fluence is carefully controlled so that the temperature is only sufficient to melt layer 11a, and amorphous layer 12, but not the underlying crystalline silicon of well 2. The laser fluence generates a temperature between about 1250 to 1300° C., to melting temperature of amorphous silicon. The laser energy density is controlled between about 0.1 to 1.5 J/cm$^2$. The laser anneal conditions used for formation of semiconductor alloy, or silicon-germanium source/drain regions 11b, from layer 11a, and the underlying amorphous silicon again resulted in a top portion of layer 11a, remaining un-reacted. This is schematically shown in FIG. 8. Un-reacted portions of silicon-germanium layer 11a, are again selectively removed in a solution. An example of such a solution can be comprised of between 30 to 32% hydrogen peroxide ($H_2O_2$), or via use of hot or boiling water at a temperature at about 90° C. or more. The re-crystallized silicon-germanium source/drain regions 11b, obtained via laser annealing applied to layer 11a, and underlying amorphous silicon, is not removed during the above selective wet etch procedure. The result of the selective removal of deposited silicon-germanium layer 11a, is schematically shown in FIG. 9.

Figure 10:
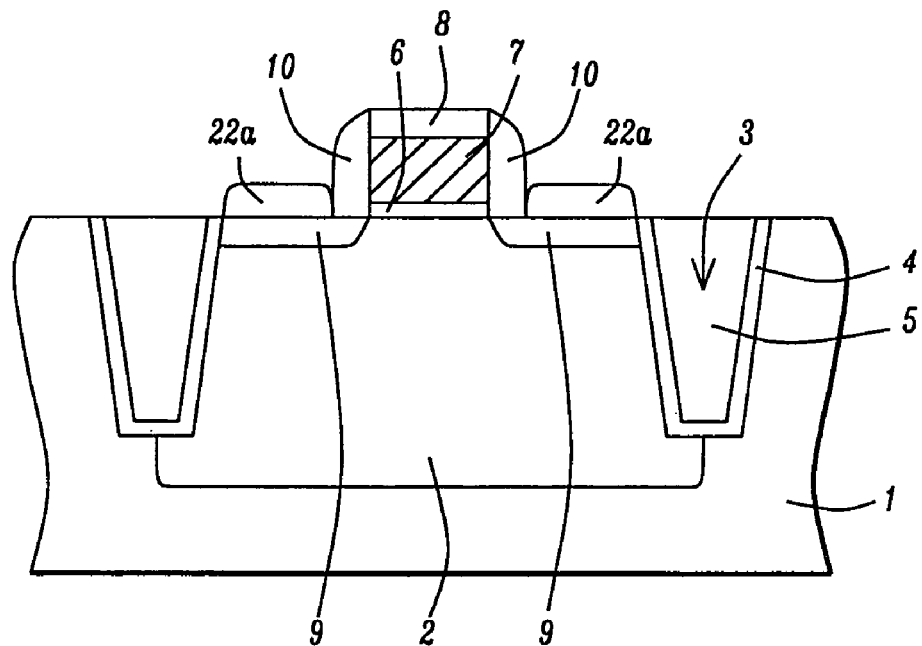
Figure 11:
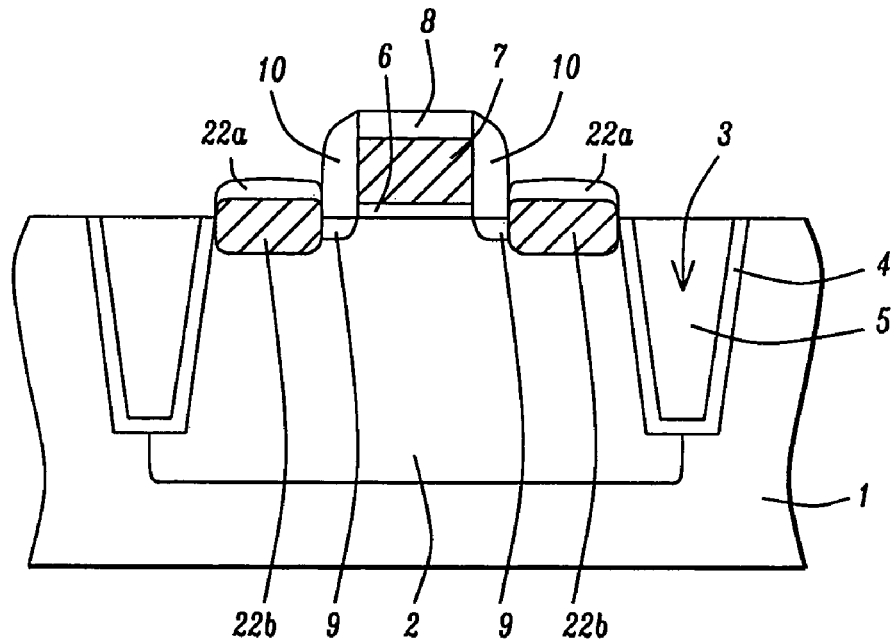
Figure 12:
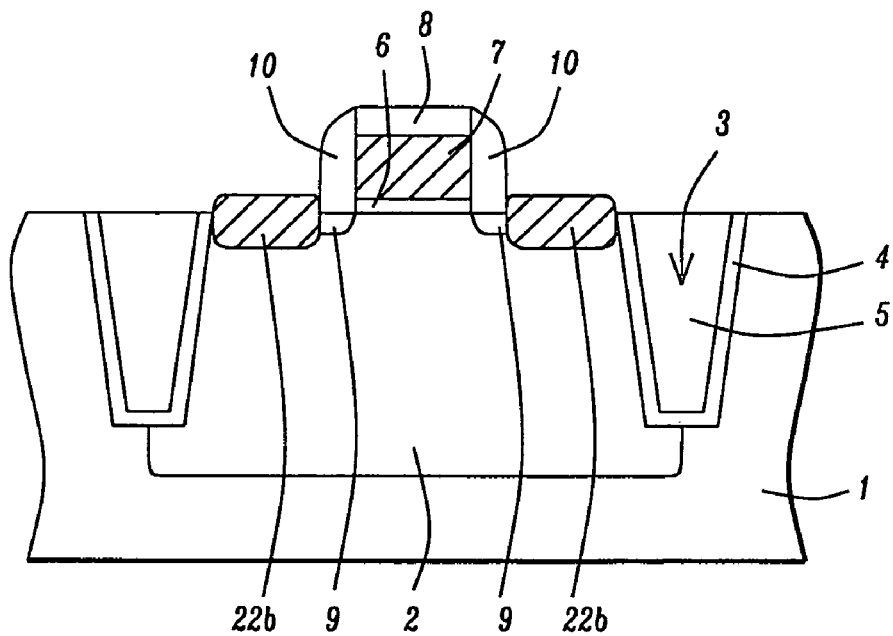

A third iteration of this invention focusing on formation of semiconductor alloy source/drain regions is next described and schematically illustrated using FIGS. 10-12. An epitaxial growth procedure is employed to selectively grow germanium or silicon-germanium regions 22a, to a thickness between about 200 to 2000 Angstroms on source/drain extension region 9. This is schematically shown in FIG. 10. Alternatively layer 22a, can also be comprised of any strain inducing element. The selective epitaxial growth procedure is performed at a temperature between about 500 to 700° C.

The same critical laser anneal procedure described for the first and second iterations of this invention is again employed to melt layer 22a, redistributing silicon and germanium atoms in melted regions with the melted regions re-crystallizing through liquid phase epitaxy forming semiconductor alloy source/drain regions 22b. The extent of formation of semiconductor alloy source/drain region 22b, is again determined via the extent of melting which in turn is determined by the laser anneal conditions. This is schematically shown in FIG. 11. Un-reacted portions of silicon-germanium layer 22a, are selectively removed in a solution. An example of such a solution can be comprised of between 30 to 32% hydrogen peroxide ($H_2O_2$), or via use of hot or boiling water at a temperature of about 90° C. or more. The re-crystallized silicon-germanium source/drain regions 22b, obtained via laser annealing applied to selectively grown epitaxial layer 22a, and underlying portions of well region 2, is not removed during the above selective wet etch procedure. The result of the selective removal of epitaxially grown silicon-germanium layer 12a, is schematically shown in FIG. 12.

Formation of the above semiconductor alloy source/drain regions will allow the portion of semiconductor material located between these semiconductor alloy source/drain regions, the MOSFET channel region, to be in a strained, either tensile or compressive state, allowing enhanced carrier mobility and enhanced MOSFET performance to be realized.

Figure 13:
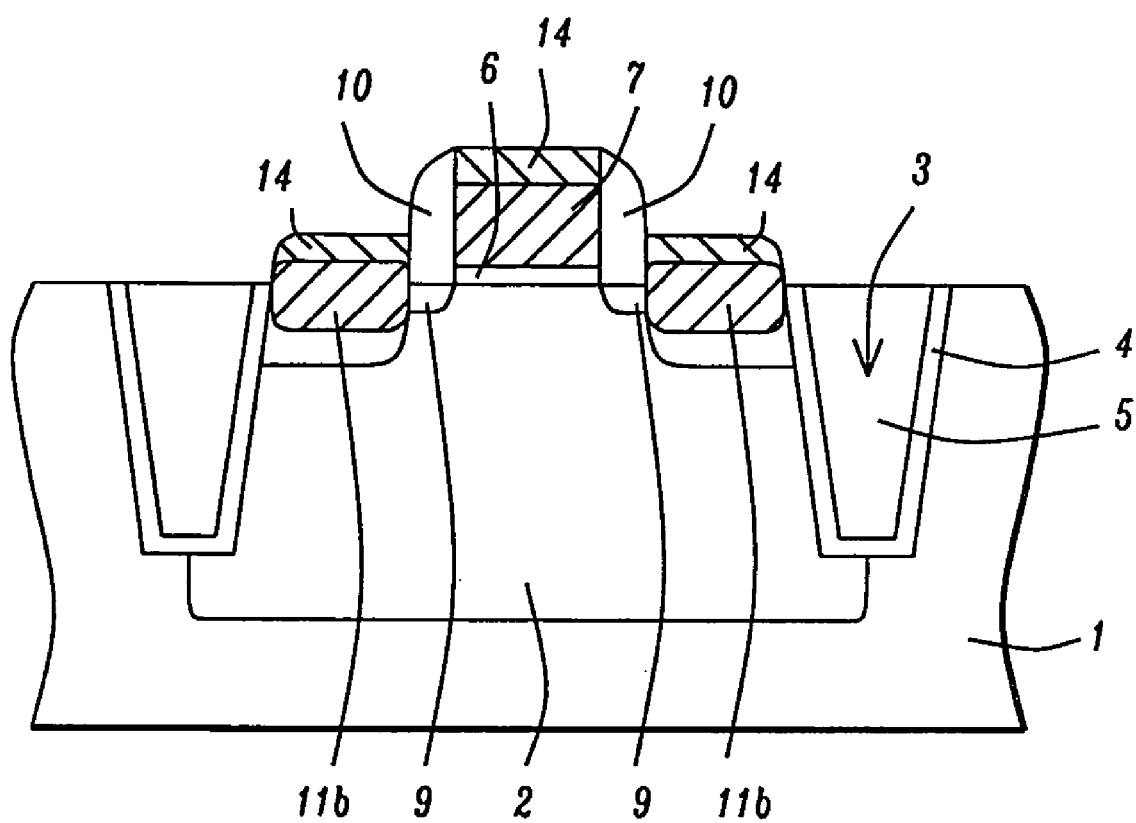

Formation of metal silicide regions 14, on semiconductor alloy source/drain regions as well as on conductive gate structure 7, is next addressed and schematically shown in FIG. 13. Hard mask shape 8, is first selectively removed via selective wet or dry etch procedures. Heavily doped source/drain regions 13, are next formed in portions of the semiconductor substrate not covered or occupied by gate structure 7, by insulator sidewall spacers 10, or STI structures 3, via implantation of N type ions (for N channel MOSFETs) or P type ions (for P channel MOSFETs). The implantation procedure is performed at an energy between about 10 to 40 KeV, an energy great enough to allow source/drain regions 13. Finally a metal layer such as tungsten, titanium, cobalt, nickel or zirconium is deposited via physical vapor deposition procedures to a thickness between about 100 to 200 Angstroms. An anneal procedure performed at a temperature between about 400 to 800° C., using a conventional or rapid thermal anneal procedure, results in formation of metal silicide regions 14, (such as tungsten silicide, titanium silicide, cobalt silicide, nickel silicide, or zirconium silicide), on the semiconductor alloy source/drain regions as well as on conductive gate structure 7. Un-reacted portions of the metal layer, portions residing on insulator sidewall spacers 10, and on STI structures 3, are selectively removed.

While this invention has been particularly shown and described with reference to, the preferred embodiments thereof, it will be understood by those skilled in the art that various changes in form and details may be made without departing from the spirit and scope of this invention.

What is claimed is:

1. A method of forming a metal oxide semiconductor field effect transistor (MOSFET) device on a semiconductor substrate featuring a strained channel region, comprising the steps of:
    providing a conductive gate structure on an underlying gate insulator layer, a source/drain extension region oppositely adjacent said conductive gate structure, and insulator sidewall spacers on sides of said conductive gate structure;
    forming a layer including a strain inducing element;
    performing an anneal procedure to form a semiconductor alloy source/drain region via consumption of uncovered portion of said source/drain extension region and via consumption of bottom portion of said layer including said strain inducing element, with said strained channel region forming in top portion of said semiconductor substrate located between semiconductor alloy source/drain region;
    removing unconsumed top portion of said layer including said strain inducing element; and
    forming a conductive source/drain region in top portions of said semiconductor substrate directly underlying said semiconductor alloy source/drain region.

2. The method of claim 1, further comprising a step of providing an insulator hard mask overlying said conductive gate structure.

3. The method of claim 1, wherein the step of forming a conductive source/drain region comprises ion implantation.

4. The method of claim 1, further comprising a step of forming metal silicide regions on said semiconductor alloy source/drain region.

5. The method of claim 1, wherein said semiconductor substrate includes a bulk silicon or silicon-on-insulator (SOI) and includes a surface orientation of <100>, <110>, or <111>.

6. The method of claim 1, wherein said MOSFET device is a P channel MOSFET device.

7. The method of claim 1, wherein said MOSFET device is an N channel MOSFET device.

8. The method of claim 1, wherein said conductive gate structure is comprised of doped polysilicon or metal or metal alloy or metal compounds, or combinations thereof.

9. The method of claim 2, wherein said insulator hard mask shape is comprised of silicon dioxide and silicon nitride.

10. The method of claim 1, wherein said insulator sidewall spacers are comprised of silicon dioxide or/and silicon nitride, or combinations thereof.

11. The method of claim 1, wherein said layer including said strain inducing element is a silicon-germanium ($Si_{1-x}Ge_x$), layer obtained via chemical vapor deposition procedures at a thickness between about 200 to 2000 Angstroms.

12. The method of claim 1, wherein the layer including said strain inducing element includes elements with an atomic spacing of more than 2% than that of silicon, examples of such elements include germanium (Ge) and carbon (C).

13. The method of claim 1, wherein a weight percent of germanium in said layer including said strain inducing element is between about 10 to 100, and more preferably 60 to 100.

14. The method of claim 1, wherein said anneal procedure is a laser anneal procedure, performed at a temperature between about 1250 to 1415° C., in an nitrogen ambient.

15. The method of claim 1, wherein said semiconductor alloy source/drain region is a silicon-germanium source/drain region.

16. The method of claim 1, wherein said unconsumed portion of said layer including said strain inducing element is removed using a solution, an example of such solution includes between about 30 to 32% hydrogen peroxide ($H_2O_2$), or via use of hot or boiling water of 90° C. or more.

17. A method of forming a MOSFET device on a semiconductor substrate wherein a source/drain region is employed to create a strained channel region, comprising the steps of:
providing a conductive gate structure on an underlying gate insulator layer, a source/drain extension region oppositely adjacent said conductive gate structure, and insulator sidewall spacers on sides of said conductive gate structure;
forming a layer including a strain inducing element;
performing a laser anneal procedure to form said source/drain region via consumption of an uncovered portion of said source/drain extension region and via consumption of a bottom portion of said layer including said strain inducing element, with said strained channel region formed in top portion of said semiconductor substrate located between said source/drain regions;
removing unconsumed top portion of said layer including said strain inducing element; and
forming a heavily doped source/drain region in top portions of said semiconductor substrate directly underlying said source/drain region.

18. The method of claim 17, wherein said MOSFET device is a P channel MOSFET device.

19. The method of claim 17, wherein said MOSFET device is an N channel MOSFET device.

20. The method of claim 17, wherein said conductive gate structure is comprised of doped polysilicon or metal or metal alloy or metal compound, or combination thereof.

21. The method of claim 17, wherein an optional insulator hard mask shape located on said conductive gate structure includes silicon oxide or/and silicon nitride.

22. The method of claim 17, wherein said insulator sidewall spacers are comprised of silicon oxide and/or silicon nitride.

23. The method of claim 17, wherein said layer including said strain inducing element is obtained via chemical vapor deposition procedures at a thickness between about 200 to 2000 Angstroms.

24. The method of claim 17, wherein said layer including said strain inducing element is selectively grown on exposed portions of said source/drain extension region to a thickness between about 200 to 2000 Angstroms.

25. The method of claim 17, wherein the layer including said strain inducing element includes elements with an atomic spacing of more than 2% than that of silicon, an example of such element includes germanium (Ge) and carbon (C).

26. The method of claim 17, wherein a weight percent of germanium in said layer including said strain inducing element is between about 10 to 100, and preferably 60 to 100.

27. The method of claim 17, wherein said laser anneal procedure is performed at a temperature between about 1250 to 1415° C., in a nitrogen ambient.

28. The method of claim 17, wherein said unconsumed portion of said layer including said strain inducing element is removed using a solution, an example of such solution includes between about 30 to 32% hydrogen peroxide ($H_2O_2$), or via use of hot or boiling water of 90° C. or more.

29. A method of forming a MOSFET device on a semiconductor substrate wherein a source/drain region is employed to form a strained channel region, comprising the steps of:
providing a conductive gate structure and an optional overlying insulator hard mask shape on an underlying gate insulator layer, a source/drain extension region oppositely adjacent said conductive gate structure, and insulator sidewall spacers on sides of said optional insulator hard mask shape and on sides of said conductive gate structure;
performing a pre-amorphization implantation (PAI) procedure forming amorphous silicon from portions of said source/drain extension regions oppositely adjacent said conductive gate structure not covered by said insulator sidewall spacers;
forming a layer including a strain inducing element;
performing a laser anneal procedure to form a semiconductor alloy source/drain region via consumption of an uncovered portion of amorphous silicon source/drain extension region and via consumption of a bottom portion of said layer including said strain inducing element, with said strained channel region formed in top portion of said semiconductor substrate located between semiconductor alloy source/drain region;
removing unconsumed top portion of said layer including said strain inducing element; and
forming a heavily doped source/drain region in portions of said semiconductor substrate directly underlying said semiconductor alloy source/drain region.

30. The method of claim 29, wherein said MOSFET device is a P channel MOSFET device.

31. The method of claim 29, wherein said MOSFET device is an N channel MOSFET device.

32. The method of claim 29, wherein said conductive gate structure is comprised of doped polysilicon or metal or metal alloy or compound.

33. The method of claim 29, wherein said optional insulator hard mask shape is comprised of silicon oxide or/and silicon nitride.

34. The method of claim 29, wherein said insulator sidewall spacers are comprised of silicon oxide and/or silicon nitride.

35. The method of claim 29, wherein said pre-amorphization implantation (PAI) 10 procedure is performed using silicon or germanium ions, at an energy between about 10 to 50 KeV, at a dose between about 1E14 to 1E16 atoms/cm².

36. The method of claim 29, wherein said layer including said strain inducing element, is obtained via chemical vapor deposition procedures at a thickness between about 200 to 2000 Angstroms.

37. The method of claim 29, wherein a weight percent of germanium in said layer including said strain inducing element is between 10 to 100, and more preferably between about 60 to 100.

38. The method of claim 29, wherein the layer including said strain inducing element includes elements with an atomic spacing of more than 2% than that of silicon, examples of such elements include germanium (Ge) and carbon (C).

39. The method of claim 29, wherein said laser anneal procedure is performed at a temperature between about 1250 to 1300° C., in a nitrogen ambient.

40. The method of claim 29, wherein said unconsumed portion of said layer including said strain inducing element is removed using a solution, an example of such solution includes between about 30 to 32% hydrogen peroxide ($H_2O_2$), or via use of hot or boiling water of 90° C. or more.

* * * * *